(12) United States Patent
Devlin et al.

(10) Patent No.: US 9,496,871 B1
(45) Date of Patent: Nov. 15, 2016

(54) PROGRAMMABLE POWER REDUCTION TECHNIQUE USING TRANSISTOR THRESHOLD DROPS

(71) Applicant: Xilinx, Inc., San Jose, CA (US)

(72) Inventors: Benjamin S. Devlin, San Francisco, CA (US); Brian C. Gaide, Erie, CO (US); Santosh Kumar Sood, New Delhi (IN)

(73) Assignee: XILINX, INC., San Jose, CA (US)

( * ) Notice: Subject to any disclaimer, the term of this patent is extended or adjusted under 35 U.S.C. 154(b) by 11 days.

(21) Appl. No.: 14/462,370

(22) Filed: Aug. 18, 2014

(51) Int. Cl.
*G11C 5/14* (2006.01)
*H03K 19/00* (2006.01)
*H03K 19/177* (2006.01)

(52) U.S. Cl.
CPC .... *H03K 19/0016* (2013.01); *H03K 19/17748* (2013.01); *G11C 5/147* (2013.01)

(58) Field of Classification Search
CPC ............... G11C 5/147; H03K 19/0016; H03K 19/00384; H03K 19/17748
See application file for complete search history.

(56) References Cited

U.S. PATENT DOCUMENTS

| | | | |
|---|---|---|---|
| 5,521,837 A | 5/1996 | Frankle et al. | |
| 5,973,552 A * | 10/1999 | Allan | H03K 19/0016 327/541 |
| 6,825,711 B2 | 11/2004 | Cohn et al. | |
| 7,262,631 B2 * | 8/2007 | Chong | H03K 19/0016 326/112 |
| 7,498,836 B1 * | 3/2009 | Tuan | G11C 5/147 326/38 |
| 7,598,802 B2 | 10/2009 | Ito | |
| 8,103,975 B2 * | 1/2012 | Lewis | H03K 19/17784 326/38 |
| 8,362,827 B2 * | 1/2013 | Takahashi | G06F 1/3203 326/33 |
| 2003/0117175 A1 * | 6/2003 | Green | G06F 1/3203 326/93 |
| 2005/0280437 A1 * | 12/2005 | Lewis | G06F 17/5054 326/38 |
| 2006/0202713 A1 * | 9/2006 | Shumarayev | G06F 17/5054 326/38 |
| 2007/0046323 A1 * | 3/2007 | Kuang | H03K 19/0016 326/26 |
| 2009/0072857 A1 * | 3/2009 | Perisetty | H03K 19/0016 326/38 |

OTHER PUBLICATIONS

Calhoun, B.H., et al., "Flexible on-chip power delivery for energy efficient heterogeneous systems," Design Automation Conference (DAC 13), May 29-Jun. 7, 2013, pp. 1-6, Austin, TX USA.

* cited by examiner

*Primary Examiner* — Jason M Crawford
*Assistant Examiner* — Kurtis R Bahr
(74) *Attorney, Agent, or Firm* — Gerald Chan

(57) ABSTRACT

An integrated circuit includes: a voltage rail; voltage control circuitry coupled to the voltage rail; and a circuit block coupled to the voltage control circuitry; wherein the voltage control circuitry is selectively configurable to operate the circuit block in at least a first mode of operation and a second mode of operation; wherein in the first mode of operation, the circuit block receives a voltage that is substantially the same as a voltage of the voltage rail; and wherein in the second mode of operation, the circuit block receives a voltage that is less than the voltage of the voltage rail by a threshold voltage.

19 Claims, 5 Drawing Sheets

PROGRAMMABLE POWER REDUCTION TECHNIQUE USING TRANSISTOR THRESHOLD DROPS

FIELD OF THE APPLICATION

The subject disclosure relates to power management on integrated circuits, such as field programmable gate arrays (FPGAs).

BACKGROUND

Power management is an important consideration in many FPGA designs. In order to increase power performance efficiency, it may be desirable to be able to reduce the dynamic power consumption of the FPGA design. One way of reducing the dynamic power consumption of an FPGA design is to lower the supply voltage used by the programmable circuit blocks of the FPGA design. However, having a lower supply voltage will cause circuit blocks to run slower and experience increased delay.

SUMMARY

An integrated circuit includes: a voltage rail; voltage control circuitry coupled to the voltage rail; and a circuit block coupled to the voltage control circuitry; wherein the voltage control circuitry is selectively configurable to operate the circuit block in at least a first mode of operation and a second mode of operation; wherein in the first mode of operation, the circuit block receives a voltage that is substantially the same as a voltage of the voltage rail; and wherein in the second mode of operation, the circuit block receives a voltage that is less than the voltage of the voltage rail by a threshold voltage.

A method of configuring one or more circuit block(s) in an integrated circuit includes: identifying a circuit block in the integrated circuit, the integrated circuit having a voltage rail and a voltage control circuitry; determining whether a criteria is satisfied; and selectively configuring the voltage control circuitry to operate the circuit block in a first mode of operation or a second mode of operation based at least in part on a result from the act of determining; wherein in the first mode of operation, the circuit block receives a voltage that is substantially the same as a voltage of the voltage rail; and wherein in the second mode of operation, the circuit block receives a voltage that is less than the voltage of the voltage rail by a threshold voltage.

Other aspects and features will be evident from reading the following detailed description.

BRIEF DESCRIPTION OF THE DRAWINGS

The drawings illustrate the design and utility of embodiments, in which similar elements are referred to by common reference numerals. These drawings are not necessarily drawn to scale. In order to better appreciate how the above-recited and other advantages and objects are obtained, a more particular description of the embodiments will be rendered which are illustrated in the accompanying drawings. These drawings depict only exemplary embodiments and are not therefore to be considered limiting of the scope of the claims.

DETAILED DESCRIPTION

Figure 1:
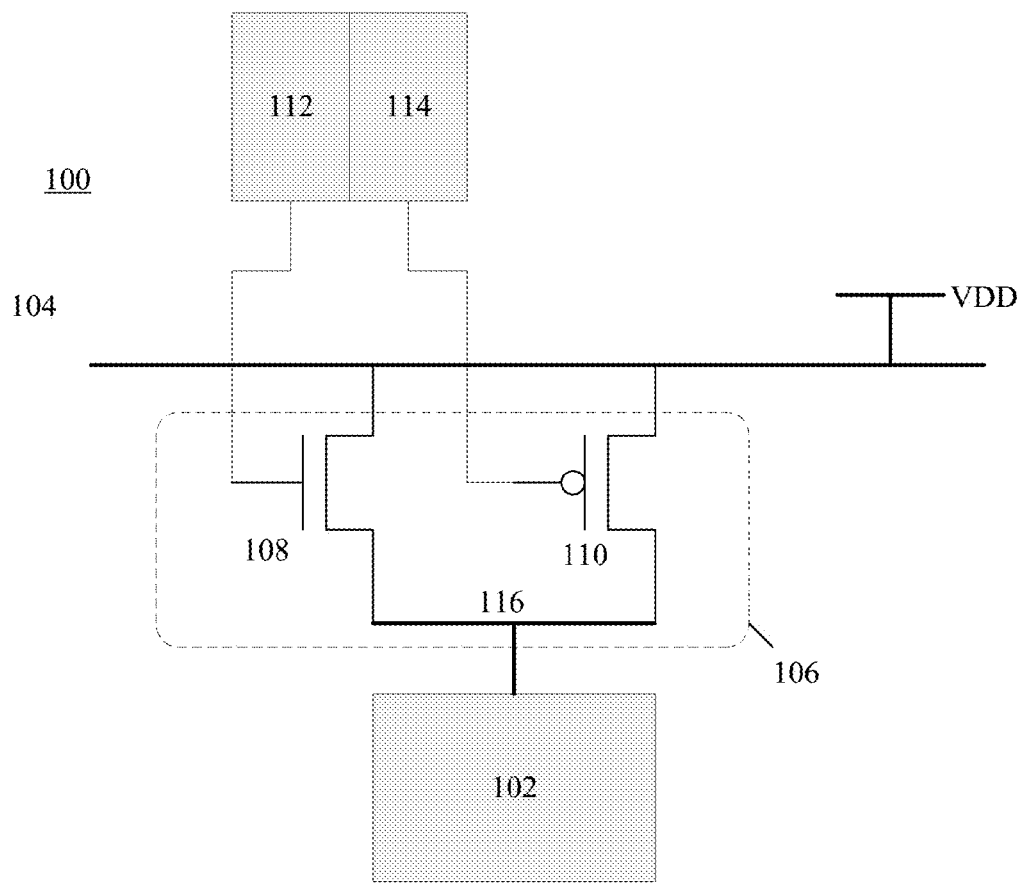
FIG. 1 illustrates a FPGA having a configurable FPGA block.

Various features are described hereinafter with reference to the figures. It should be noted that the figures are not drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated embodiment need not have all the aspects or advantages shown. An aspect or an advantage described in conjunction with a particular embodiment is not necessarily limited to that embodiment and can be practiced in any other embodiments, even if not so illustrated, or if not explicitly described. Also, reference throughout this specification to "some embodiments" or "other embodiments" means that a particular feature, structure, material, or characteristic described in connection with the embodiments is included in at least one embodiment. Thus, the appearances of the phrase "in some embodiments" or "in other embodiments" in various places throughout this specification are not necessarily referring to the same embodiment or embodiments.

In a FPGA design, some circuit blocks (FPGA blocks) of the FPGA design may be located on critical path, while other circuit blocks of the FPGA design may be located on non-critical path. A critical path may refer to a path in the FPGA design that has a slack less than a predetermined threshold, wherein the slack measures a margin by which the path meets a timing requirement of the FPGA design. On the other hand, a non-critical path may have a slack that exceeds the predetermined amount. Thus, a circuit block located on a critical path of the FPGA design will have a relatively lower amount of slack, and thus may not be run slower without violating a timing requirement of the FPGA design. On the other hand, a circuit block located on a non-critical path may have a relatively higher amount of slack, and may be run slower while still allowing the path that it is on to meet the timing requirements of the FPGA design.

As FPGA performance increases due to technological advancements, many FPGA designs fail to take advantage of the increased performance that the individual FPGA blocks may be capable of. Thus, a large proportion of FPGA circuit blocks in such designs will be located on non-critical paths, and they may operate slower than they are capable of.

Because circuit blocks of a FPGA design running at a lower supply voltage will run slower, circuit blocks of the FPGA that are on a critical path should not be run with a lower supply voltage, in order to preserve the performance of the FPGA design. On the other hand, circuit blocks of the FPGA that are not on a critical path may have extra slack and may run slower than they are capable of. Thus, these circuit blocks may be run with a lower supply voltage in order to conserve power, which increases the delay for those circuit blocks without degrading performance of the FPGA design as a whole.

It would thus be advantageous to have certain circuit blocks of an FPGA design run on a lower supply voltage in order to conserve power. However, because whether a circuit block of an FPGA is on a critical path cannot be determined until the design has been programmed, circuit blocks on the FPGA cannot be pre-configured to use a certain supply voltage. Instead, the supply voltage for the circuit block must also be dynamic and programmable.

In addition, conventional methods for configuring the supply voltages of circuit blocks typically utilize multiple voltage rails, such as a high voltage rail and a low voltage rail, wherein circuit blocks may be connected to either the high voltage or low voltage rail depending on whether they are on a critical path. However, having a completely separate voltage supply rail and its correspond voltage source circuitry typically requires a large amount of area overhead on an FPGA.

Therefore, there is a need for an area-efficient way dynamically configure supply voltages for circuit blocks in an FPGA for power-saving purposes.

FIG. 1 illustrates a FPGA portion 100 having a configurable (e.g., programmable) circuit block 102 (hereinafter, block 102). The FPGA portion 100 also includes a voltage rail 104, which is configured to provide a supply voltage to the various blocks and circuits of the FPGA portion 100. The block 102 may be a circuit or a group of circuits in the FPGA portion 100. For example, the block 102 may be one or a plurality of programmable circuits in the FPGA portion 100, including but not limited to configurable logic element(s) (CLE), CLE(s) with interconnect(s) (INT), lookup table (LUT) group(s), or LUT(s). The circuits that comprise the block 102 may be grouped based upon a variety of factors, such as available area on the FPGA portion 100 and/or a desired control granularity. For example, if programmable circuits in the FPGA portion 100 are divided into a larger number of blocks 102, more control of the voltage levels for individual circuit elements may be achieved, at the expense of FPGA area.

The voltage rail 104 is configured to have a supply voltage $V_{DD}$, and is connected to block 102 through voltage control circuitry 106. While only one block 102 is illustrated in the figure, it is understood that the FPGA portion 100 may comprise many blocks 102, having respective voltage control circuitries 106 connecting them to the common voltage rail 104.

In some embodiments, the voltage control circuitry 106 comprises a plurality of transistors, which may include an NMOS transistor 108 and a PMOS transistor 110 connected in parallel. As shown in the figure, the FPGA portion 100 also includes memory cells 112 and 114 configured to send gate control signals to the NMOS transistor 108 and the PMOS transistor 110, respectively. For example, the memory cell 112 may send a high signal to the gate of the NMOS transistor 108 in order to turn on the NMOS transistor 108, and send a low signal to the gate of NMOS transistor 108 in order to turn off NMOS transistor 108. Similarly, the memory cell 114 may send a low signal to the gate of the PMOS transistor 110 in order to turn on the PMOS transistor 110, and send a high signal to the gate of PMOS transistor 110 in order to turn off PMOS transistor 110. The FPGA portion 100 may also further include a controller (not shown) to configure the memory cells 112 and 114 during the place and route phase of the FPGA design, allowing for the NMOS transistor 108 and the PMOS transistor 110 to be dynamically configured prior to operation. In other embodiments, the controller may not be a part of the FPGA portion 100 and may be external and/or remote from the FPGA portion 100.

The states of the NMOS transistor 108 and the PMOS transistor 110 may be selectively configured so that the block 102 can operate in one of three different operating modes: a first mode of operation that is a "normal mode", a second mode of operation that is a "low voltage mode", and a third mode of operation that is a "power gated mode". In some cases, the NMOS transistor 108 and the PMOS transistor 110 may be configured when the FPGA portion 100 is being programmed with bit-stream. In other cases, the NMOS transistor 108 and the PMOS transistor 110 may be configured after the FPGA portion 100 has been programmed with bit-stream (e.g., during operation of the FPGA portion 100).

In some cases, if the block 102 is located on a critical path of the FPGA design, then the block 102 may run in the "normal mode". In the "normal mode", the block 102 is run with the full $V_{DD}$ supply voltage of voltage rail 104, so that block 102 can be run at its full speed. The block 102, when being in the "normal mode" may receive a voltage that is substantially the same (e.g., less than 5% difference) as the voltage of the voltage rail 104. In some embodiments, in order to configure the block 102 to run in the "normal mode', the PMOS transistor 110 is turned on, while the NMOS transistor 108 is turned off. In other embodiments, both the PMOS transistor 110 and the NMOS transistor 108 may be turned on. If both the NMOS transistor 108 and the PMOS transistor 110 are turned on, more current will be able to flow from the voltage rail 104 to the block 102, and the resistance from the NMOS transistor 108 and the PMOS transistor 110 will be less.

Because there is no voltage drop over the PMOS transistor 110 when it is turned on, the block 102 receives the full $V_{DD}$ supply voltage of the voltage rail 104, and thus can run at its full speed. Because the block 102 of the FPGA portion 100 in this example is located on a critical path, the block 102 may run in the "normal mode", without degrading the performance of the FPGA design.

In other cases, the block 102 may not be on a critical path. In such cases, the block 102 may run in the "low voltage mode". In the "low voltage mode", the block 102 runs on a voltage that is lower than the $V_{DD}$ supply voltage from the voltage rail 104. Such allows for power savings in comparison to block running in the "normal mode", without degrading the performance of the FPGA design.

In the "low voltage mode", only the NMOS transistor 108 is turned on and operates in the nonlinear region, while the PMOS 110 transistor is turned off. Due to a voltage drop over the NMOS transistor 108 corresponding to a threshold voltage $V_{th}$ of the NMOS transistor 108, the block 102 operates with a "virtual $V_{DD}$" voltage, represented by virtual voltage rail 116 corresponding to the voltage of the source of NMOS transistor 108, which is lower than the $V_{DD}$ supply voltage of the voltage rail 104 (corresponding to the voltage of the drain of NMOS transistor 108) by $V_{th}$.

Also, in some embodiments, the voltage drop may be determined based on the following equations (where NMOS is a voltage source):

$$I_D = \frac{\mu_n C_{ox}}{2}\left(\frac{W}{L}\right)(V_{DD} - V_{out} - V_{THn})^2$$

and $$V_{out} = V_{DD} - V_{THn} - \sqrt{\frac{I_D}{\frac{\mu_n C_{ox}}{2}\left(\frac{W}{L}\right)}}$$

wherein, $I_D$=current, W=NMOS width, L=NMOS length, $\mu_n C_{ox}$=process dependent term (Un is mobility and Cox is gate-oxide capacitance), $V_{THn}$=NMOS threshold voltage, and $V_{out}$=virtual voltage. The voltage drop VD may then be determined as VD=$V_{DD}$-$V_{out}$.

Thus, in some embodiments, the amount of the voltage drop VD for the "low voltage mode" may be configured by selecting the size and other properties of the NMOS transistor 108. In some embodiments, the voltage drop VD is configured to be between approximately 100 mV and 200 mV. In other embodiments, the voltage drop VD may be configured to have other values. Also, in some embodiments, the voltage drop VD may be configured to be between 10% and 50%, and more preferably between 10% and 30%, of the $V_{DD}$ supply voltage. In some cases, as illustrated in the equations in the above paragraph, the voltage drop may be selectively adjusted based on a selection of the NMOS width (W) and/or NMOS length (L). For example, the parameters W, L may be changed during physical layout design of a FPGA to alter the voltage drop VD. In other cases, the current $I_D$ may be altered during operation of the FPGA by changing a switching or activity rate on a power gated block, which may change the current draw through the NMOS (or PMOS if PMOS is used). In further cases, the virtual voltage $V_{DD}$ may be changed by changing a voltage supply from the voltage regulator to thereby affect the voltage drop VD. In other cases, the NMOS threshold $V_{THn}$ (or $V_{THp}$ if PMOS is used) may be changed during a physical layout design of the FPGA by using lower or higher threshold transistors.

Because the voltage drop may be effected by the amount of current drawn by the block 102 through the NMOS transistor 108, a maximum current $I_D$ for block 102 may be calculated, and the NMOS transistor 108 may sized such that the voltage drop VD remains below a predetermined threshold or within an acceptable range even with the maximum current $I_D$ (in order to keep the increased delay due to the lower voltage below a predetermined threshold). In addition, or alternatively, certain properties of NMOS transistor 108 may be configured to achieve a desired $V_{THn}$.

Because dynamic power consumption of a FPGA scales in a squared relationship with voltage ($P \propto V^2$), even a small reduction in voltage may correspond to a significant reduction in dynamic power consumption during operation of the FPGA.

Although only one block 102 is shown, it should be understood that the FPGA portion 100 may have a plurality of blocks 102. One or more block(s) 102 may be running in the "low voltage mode" while one or more other block(s) 102 may be running in the "normal mode". In some cases, level shifter(s) may be used to connect two or more block(s) 102 of the FPGA. A level shifter is a circuit that interfaces output connections from a circuit operating on a lower voltage supply, to input connections on a circuit that is operating on a higher voltage supply. This allows for correct operation between circuits with different voltage supply levels. In some cases, if the voltage drop for the "low voltage mode" is relatively small, no level shifters will be needed to connect block(s) 102 of the FPGA running in the "low voltage mode" to block(s) 102 running in the "normal mode". On the other hand, if the voltage drop is large, level shifters may be required to connect block(s) running in the "low voltage mode" to block(s) 102 running in the "normal mode", which may occupy additional area on the FPGA.

Also, because the NMOS transistor 108 is operating in the saturation or nonlinear region during the "low voltage mode", it will experience a relatively constant current supply regardless of the demand of the block 102. This provides resistance to current swings over time from causing variations in the voltage drop of NMOS 108, and hence variations of the virtual $V_{DD}$ voltage, also known as "voltage supply bounce." Such current swings may be due to, for example, a rising clock edge arriving and causing many flip-flops in the vicinity of the block to change state.

In the "low voltage mode", the lower voltage of the virtual voltage rail 116 may result in the block 102 operating slower and with increased delay. Thus the "low voltage mode" may be used for block(s) 102 not on a critical path of the FPGA design, and having sufficient extra slack such that the increased delay caused by the lower supply voltage does not degrade the performance of the FPGA design.

Blocks operating in "low voltage mode" may also have decreased power leakage. This is due to the addition of NMOS 108 being placed in series with the transistors of the block 102, increasing the effective resistance of block 102 and reducing the voltage of virtual voltage rail 116. Because transistor leakage is a function of voltage, the increase in effective resistance and decrease in voltage result in a leakage drop of the transistors of the block 102. In some cases, the transistor leakage may be a nonlinear function of voltage, and so a drop in the internal voltage rail may cause a cubic leakage drop in the transistors.

In some cases, the block 102 may not be an "active" block (e.g., an "inactive" circuit block) in the sense that it is not used during normal operation of the FPGA portion 100. This is possible because a FPGA design may make use of only a subset of all blocks on the FPGA. Accordingly, in some cases, the block 102 may not be a part of a particular FPGA design. However, during operation of the FPGA portion 100, even if the block 102 is inactive, it may draw leakage current from the voltage rail 104, causing an increase in the static power consumption of the FPGA portion 100. In these situations, the "power gated mode" may be used. In the "power gated mode", both the NMOS transistor 108 and the PMOS transistor 110 are turned off, reducing the leakage current that can be drawn by the block 102.

The properties of the three operating modes described above are summarized in Table 1 below:

TABLE 1

| Operating mode | Normal | Low Voltage | Power gate |
| --- | --- | --- | --- |
| State of PMOS transistor | ON | OFF | OFF |
| State of NMOS transistor | ON (or OFF) | ON | OFF |
| Circuit operation | Normal operation | Operation with increased delay, due to reduced supply voltage | No operation |
| Power saving properties | No power savings | Dynamic power consumption reduced due to reduced supply voltage, reduced power leakage | Reduced power leakage |

In some embodiments, the sizes of the NMOS transistor 108 and the PMOS transistor 110 may be configured based upon the current that will be drawn by the block 102 during operation. For example, the NMOS 108 transistor and the PMOS transistor 110 may be made larger if the current draw of the block 102 is larger, or vice versa.

The area overhead of the voltage control circuitry 106 (comprising the NMOS 108 transistor and the PMOS transistor 110) for the block 102 is much smaller than previous solutions, which require an entirely separate and additional voltage rail and associated voltage control circuitry connecting the separate and additional voltage rail to the block. For example, it has been found that for an 8-input lookup table (LUT8) block, the additional area overhead caused by NMOS transistor 108 and PMOS transistor 110 is approximately 1% of the existing area overhead of the LUT8. In addition, because the FPGA portion 100 may have unused memory cells, the memory cells 112 and 114 used to control NMOS transistor 108 and the PMOS transistor 110 incur no additional area overhead, as they may simply be any unused memory cells of the FPGA portion 100.

It should be noted that although the block 102 is described as having three operation modes ("normal mode", "low voltage mode", and "power gated mode"), in other embodiments, the block 102 may have only two operation mode (e.g., "normal mode" and "low voltage mode"). Also, in further embodiments, the block 102 may have more than three operation modes.

Figure 2:
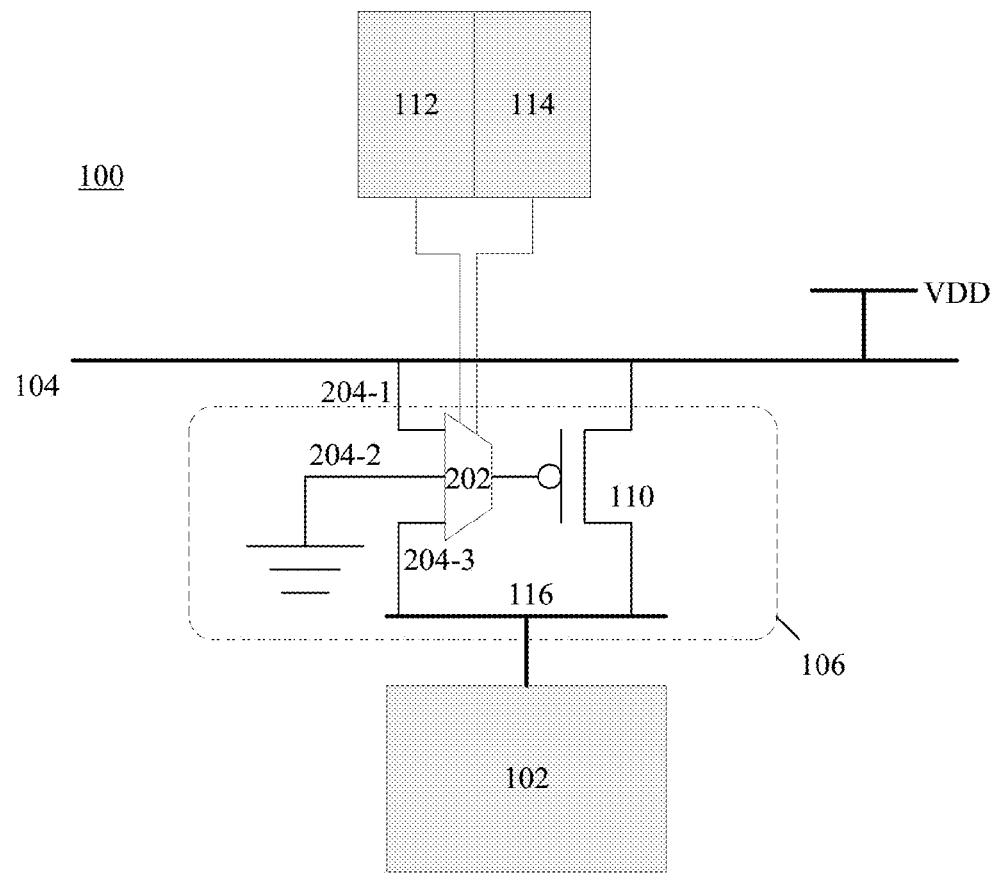
FIG. 2 illustrates another FPGA having a configurable FPGA block.

FIG. 2 illustrates another FPGA portion 100 having a configurable FPGA block in accordance other embodiments. Unlike the FPGA portion 100 illustrated in FIG. 1, the voltage control circuitry 106 in the FPGA portion 100 of FIG. 2 contains a single PMOS transistor 110 connecting the block 102 to the voltage rail 104, with no corresponding NMOS transistor 108. In addition, instead of the gate of the PMOS transistor 110 being controlled by the memory cell 114, it is connected to an output of a multiplexer (MUX) 202. The use of the MUX 202 (instead of the NMOS transistor 108) in the voltage control circuitry 106 may further decrease area overhead, as the MUX 202 may be small in comparison to the NMOS transistor 108. Also, while the NMOS transistor 108 may need to be sized based upon a current draw of the block 102, any transistors that make up the MUX 202 have no such restrictions.

The block 102 of the FPGA portion 100 of FIG. 2 can also operate in one of three different operating modes based on a selective configuration of the voltage control circuitry 106: a first mode of operation that is a "normal mode", a second mode of operation that is a "low voltage mode", and a third mode of operation that is a "power gated mode", like the FPGA portion 100 of FIG. 1. In particular, the MUX 202 may be selectively configured to receive one of three inputs: a first input 204-1 connected to the voltage rail 104, a second input 204-2 connected to ground, and a third input 204-3 connected to virtual voltage rail 116. Each input corresponds to an operating mode described above. The memory cells 112 and 114 may be used to control the selection of the input for the MUX 202.

When the first input 204-1 is selected, the MUX 202 is connected to the voltage rail 104 (so that the MUX 202 receives input from the voltage rail 104), and the voltage provided to the gate of the PMOS transistor 110 is the substantially the same (e.g., less than 5% difference) as the $V_{DD}$ supply voltage of the voltage rail 104. In some embodiments, a control signal may be transmitted to the MUX 202 to selectively configure the MUX 202 so that it connects to the voltage rail 104. Thus the PMOS transistor 110 will be off, and no current will flow between the voltage rail 104 and the block 102. This results in block 102 being in the "power gated mode".

When the second input 204-2 is selected, the MUX 202 is connected to ground, and the gate of the PMOS transistor 110 is also connected to ground accordingly. In some embodiments, a control signal may be transmitted to the MUX 202 to selectively configure the MUX 202 so that it connects to the ground. Thus, the PMOS transistor 110 is fully on, resulting in the block 102 running in the "normal mode". In such configuration, the block 102 receives the full $V_{DD}$ supply voltage from the voltage rail 104.

When the third input 204-3 is selected, the MUX 202 is connected to the virtual voltage rail 116 (so that the MUX 202 receives input from the virtual voltage rail 116), and the gate of the PMOS transistor 110 is also connected to the virtual voltage rail 116 accordingly. In some embodiments, a control signal may be transmitted to the MUX 202 to selectively configure the MUX 202 so that it connects to the virtual voltage rail 116. This results in the PMOS transistor 110 being only partially on and operating in the saturation/nonlinear region. While current will be able to flow to the block 102 from the voltage rail 104, there will be a voltage drop such that the voltage of the virtual voltage rail 116 will be lower than the $V_{DD}$ supply voltage of the voltage rail 104. Therefore, the block 102 will run in the "low voltage mode".

In some embodiments, the voltage drop corresponds approximately to $V_{THp}$, wherein $V_{THp}$ is a threshold voltage of PMOS transistor 110. Also, in some embodiments, the voltage drop may be determined based on the following equations (where PMOS is a voltage source):

$$I_D = \frac{\mu_n C_{ox}}{2} \left(\frac{W}{L}\right)(V_{DD} - V_{out} - |V_{THp}|)^2$$

and $$V_{out} = V_{DD} - |V_{THp}| - \sqrt{\frac{I_D}{\frac{\mu_n C_{ox}}{2}\left(\frac{W}{L}\right)}}$$

wherein, $I_D$=current, W=PMOS width, L=PMOS length, $\mu_n C_{ox}$=process dependent term ($U_n$ is mobility and $C_{ox}$ is gate-oxide capacitance), $V_{THp}$=PMOS threshold voltage, and $V_{out}$=virtual voltage. The voltage drop VD may then be determined as VD=$V_{DD}$-$V_{out}$.

In some embodiments, because the voltage drop VD is effected by the amount of current $I_D$ drawn by block 102 through PMOS transistor 110, a maximum current $I_D$ for block 102 may be calculated, and PMOS transistor 110 may be sized such that the voltage drop VD when block 102 is drawing the maximum current $I_D$ remains below a predetermined threshold or within an acceptable range (in order to keep the increased delay due to the lower voltage below a predetermined threshold). In addition, or alternatively, certain properties of PMOS transistor 110 may be configured to achieve a desired $V_{THp}$.

The properties of the three operating modes described above are summarized in Table 2 below.

TABLE 2

| Operating mode | Normal | Low Voltage | Power gate |
| --- | --- | --- | --- |
| MUX input | 2 | 3 | 1 |
| State of PMOS transistor | ON | Partially ON | OFF |
| Circuit operation | Normal operation | Operation with increased delay, due to reduced supply voltage | No operation |

TABLE 2-continued

| Operating mode | Normal | Low Voltage | Power gate |
|---|---|---|---|
| Power saving properties | No power savings | Dynamic power consumption reduced due to reduced supply voltage, reduced power leakage | Reduced power leakage |

It should be noted that although the block 102 is described as having three operation modes ("normal mode", "low voltage mode", and "power gated mode"), in other embodiments, the block 102 may have only two operation mode (e.g., "normal mode" and "low voltage mode"). Also, in further embodiments, the block 102 may have more than three operation modes.

Figure 3:
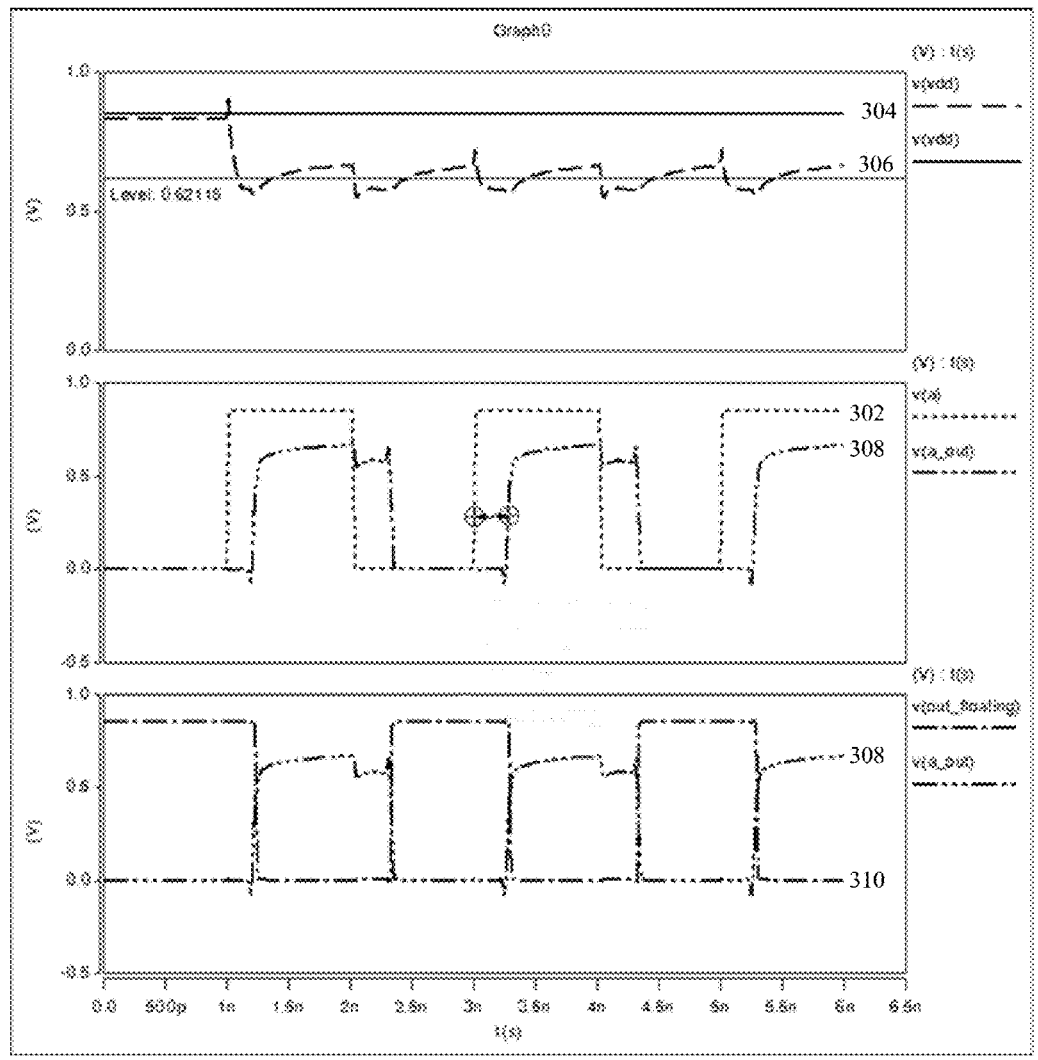
FIG. 3 illustrates graphs for a simulated FPGA block.

FIG. 3 illustrates graphs showing examples of simulated tests for the block 102 having configurable supply voltage in accordance with some embodiments. In the illustrated example, the block 102 is a LUT8 block configured to receive a 1 GHz input signal, represented by curve 302. In other example, the block 102 may be other types of block and/or may be configured to receive input signal having other values. Also, in the example, the PMOS transistor 110 and the NMOS transistor 108 of the voltage control circuitry 106 have dimensions of approximately 20 nm by 154 nm, and 20 nm by 298 nm, respectively. The $V_{DD}$ supply voltage is 0.85V, represented by voltage line 304, while the "virtual $V_{DD}$" of the virtual voltage rail is approximately 0.6V, represented by voltage curve 306. In other examples, the PMOS transistor 110 and the NMOS transistor 108 may have other dimensions. Also, in other examples, the $V_{DD}$ supply voltage and the virtual $V_{DD}$ of the virtual voltage rail may have other values that are different from the examples mentioned above.

Output curve 308 represents an output of the block 102 running in the "low voltage mode" and receiving input curve 302. Output curve 310 represents a result of output curve 308 being put through an inverter, demonstrating that the output of a block 102 running in "low voltage mode" can be fed into an inverter or buffer to drive a block running in "normal mode" without the use of level shifters.

In the illustrated example, the delay of processing by the block 102 is approximately 105 ps in the "normal mode", but, as can been seen in FIG. 3, it increases to approximately 273 ps in the "low voltage mode". However, in the "normal mode", the block 102 consumes approximately 5.50 uW of power, while in the "low voltage mode", the block 102 consumes approximately 4.35 uW of power, resulting in a power reduction of approximately 21%, which takes into account any leakage increases from not using level shifters. Because the voltage drop is relatively small, the output of the block 102 can achieve full swing without the use of a level shifter when connecting to any neighboring blocks running in the "normal mode". In other examples, the delay of processing by the block 102 may be different from 105 ps in the "normal mode", and may have other values in the "low voltage mode". Also, in other examples, the block 102 may consume power that is different from 5.50 uW in the "normal mode", and power that is different from 4.35 uW in the "low voltage mode".

Although only one block 102 is shown in FIG. 1 and in FIG. 2, it should be understood that the FPGA portion 100 of FIG. 1 or FIG. 2 may have a plurality of blocks 102 with respective voltage control circuitries 106. One or more block(s) 102 may be running in the "low voltage mode" while one or more other block(s) 102 may be running in the "normal mode". Also, there may be one or more block(s) 102 that is not "active" block(s), and may be running in the "power gated mode".

In some embodiments, a global linear program may be used to determine which blocks are to operate in which mode. A user may use the global linear program to specify one or more constraints C. For example, a constraint C corresponding to slack for a path in the FPGA design may be described as C=(clock cyle–path delay–$\Sigma D_n A_n$), wherein $A_n$ corresponds to a state of a block n located on the path (e.g., having a value of 0 for "normal mode" and a 1 for "low voltage mode"), while $D_n$ corresponds to a worst-case delay increase for the path caused by block n if it is in "low voltage mode" (e.g., the amount of increased delay when block n is drawing a maximum amount of current). In some embodiments, the worst-case delay $D_n$ may be different on different paths, even for the same block n. Thus an equation may be generated for each path in the design. In this way the global linear program may be used to find the ideal combination that minimizes slack C by determining blocks that can be set in "low voltage mode."

Figure 4:
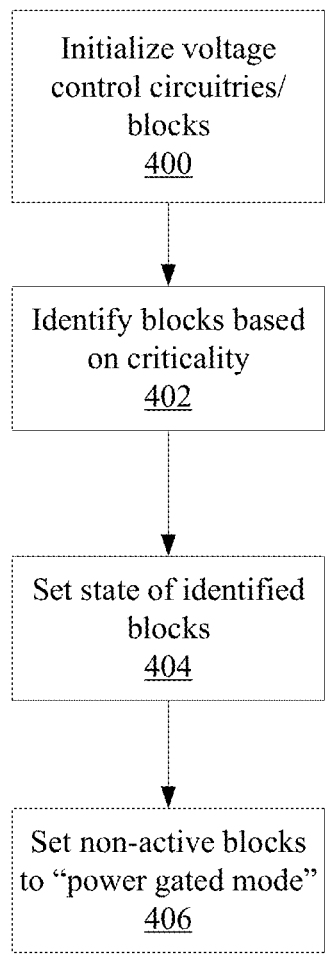
FIG. 4 illustrates a method of configuring one or more FPGA block(s).

FIG. 4 illustrates a method of configuring one or more block(s) of an FPGA (e.g., the FPGA portion 100 of FIG. 1 or FIG. 2) during a place and route phase in accordance with some embodiments. First, at item 400, the voltage control circuitries 106 and blocks 102 of the FPGA are initialized. In a first embodiment, all blocks 102 are initially set to "normal mode." This may be used for achieving the highest possible clock frequency for the FPGA design. In a second embodiment, all blocks 102 are initially set to "low voltage mode." This may be used for achieving a design that reaches a target frequency using the lowest amount of power.

At item 402, blocks are identified based upon criticality, and set to an appropriate state at item 404. In the first embodiment, blocks that are not on a critical path (e.g., have a slack greater than a predetermined threshold) are identified and set to "low voltage mode." This may be done using any of the above-described techniques (e.g., turning off the PMOS transistor 110 and turning on the NMOS transistor 108 as discussed with reference to FIG. 1, or connecting the PMOS transistor 110 to the virtual voltage rail 116 through the MUX 202 as discussed with reference to FIG. 2).

In the second embodiment, blocks on a critical path (e.g., having a slack lower than a predetermined threshold) are identified and set to "normal mode." This may be done using any of the above-described techniques (e.g., turning on the PMOS transistor 110 and the NMOS transistor 108 as discussed with reference to FIG. 1, or connecting the PMOS transistor 110 to ground through the MUX 202 as discussed with reference to FIG. 2).

At item 406, all non-active blocks (e.g., blocks not part of the FPGA design) are set to "power gated mode" in order to reduce power leakage.

As a result of the method of FIG. 4, all FPGA blocks on a critical path of the FPGA design are configured to be run in the "normal mode", and all blocks not in a critical path are configured to be run in the "low voltage mode", thereby reducing dynamic power consumption without degrading the performance of the overall FPGA design. Also all blocks that are not parts of the FPGA design are configured to be run in the "power gated mode" to reduce leakage current. In other embodiments, item 406 is optional and may be excluded from the method.

In another embodiment, all blocks are initially set to "power gated mode" during initialization at item 400. At item 402, blocks are identified based on whether or not they are on a critical path of the FPGA design, or on a non-critical path of the FPGA design. All blocks identified as being on a critical path are set to "normal mode" at item 404, while all blocks not on a critical path are set to "low voltage mode."

In other embodiments, in addition to, or instead of, identifying blocks based whether they are on a critical path (as in item 402), another criteria may be determined to see if it is satisfied, and set to an appropriate mode based on the criteria at item 404.

Figure 5:
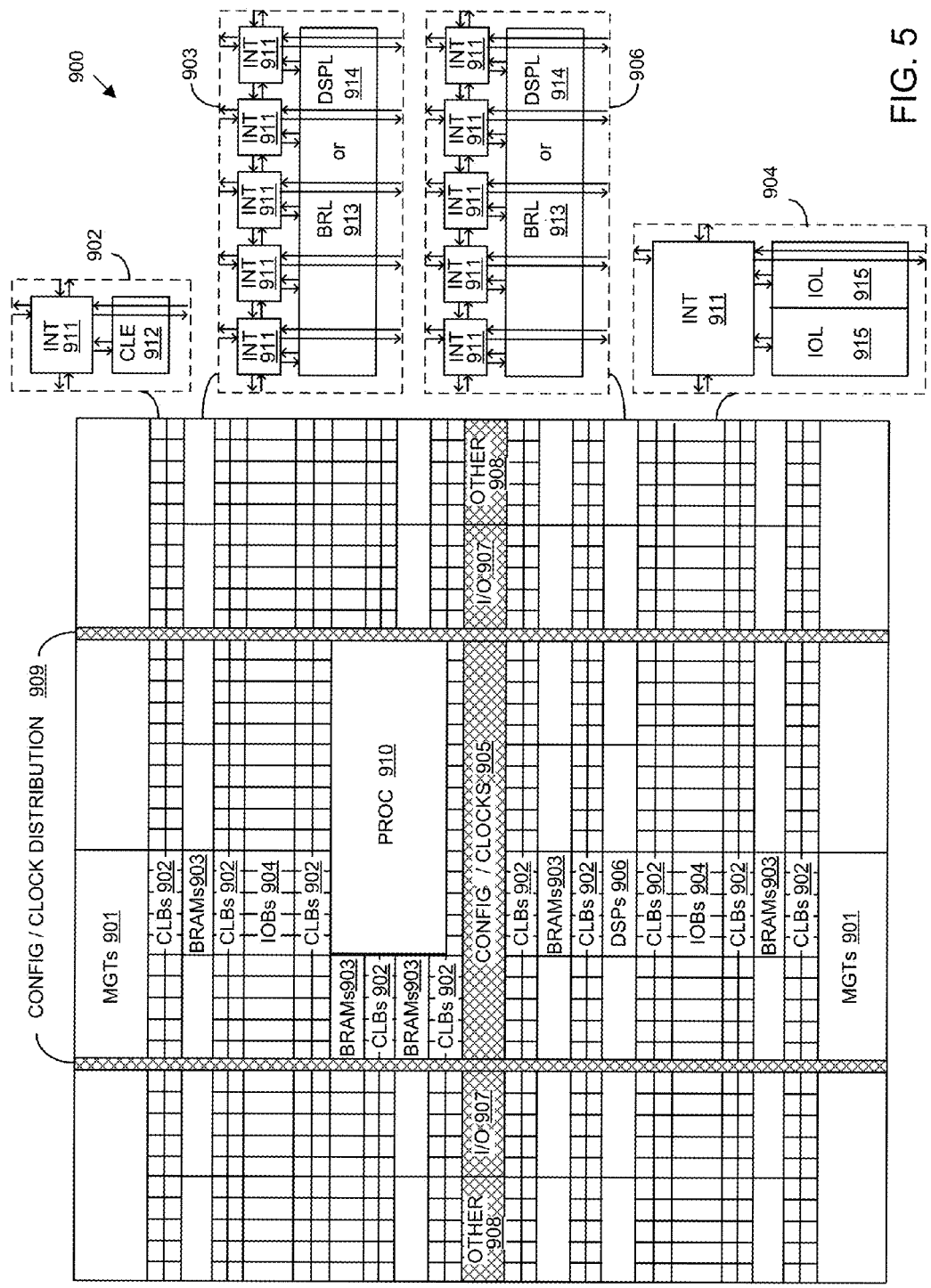
FIG. 5 is a block diagram illustrating an exemplary architecture for an IC.

In the above embodiments, the various features have been described with reference to the FPGA portion 100. The FPGA portion 100, or any part of it, such as the circuit block 102, may be any component or combination of components in a FPGA. FIG. 5 is a block diagram illustrating an exemplary architecture 900 for an IC. In one aspect, architecture 900 is implemented within a field programmable gate array (FPGA) type of IC. As shown, architecture 900 includes several different types of programmable circuit, e.g., logic, blocks. For example, architecture 900 can include a large number of different programmable tiles including multi-gigabit transceivers (MGTs) 901, configurable logic blocks (CLBs) 902, random access memory blocks (BRAMs) 903, input/output blocks (IOBs) 904, configuration and clocking logic (CONFIG/CLOCKS) 905, digital signal processing blocks (DSPs) 906, specialized I/O blocks 907 (e.g., configuration ports and clock ports), and other programmable logic 908 such as digital clock managers, analog-to-digital converters, system monitoring logic, and so forth.

In some ICs, each programmable tile includes a programmable interconnect element (INT) 911 having standardized connections to and from a corresponding INT 911 in each adjacent tile. Therefore, INTs 911, taken together, implement the programmable interconnect structure for the illustrated IC. Each INT 911 also includes the connections to and from the programmable logic element within the same tile, as shown by the examples included at the top of FIG. 5.

For example, a CLB 902 can include a configurable logic element (CLE) 912 that can be programmed to implement user logic plus a single INT 911. A BRAM 903 can include a BRAM logic element (BRL) 913 in addition to one or more INTs 911. Typically, the number of INTs 911 included in a tile depends on the height of the tile. As pictured, a BRAM tile has the same height as five CLBs, but other numbers (e.g., four) also can be used. A DSP tile 906 can include a DSP logic element (DSPL) 914 in addition to an appropriate number of INTs 911. An IOB 904 can include, for example, two instances of an I/O logic element (IOL) 915 in addition to one instance of an INT 911. As will be clear to those of skill in the art, the actual I/O pads connected, for example, to IOL 915 typically are not confined to the area of IOL 915.

In the example pictured in FIG. 5, a columnar area near the center of the die, e.g., formed of regions 905, 907, and 908, can be used for configuration, clock, and other control logic. Horizontal areas 909 extending from this column are used to distribute the clocks and configuration signals across the breadth of the programmable IC.

Some ICs utilizing the architecture illustrated in FIG. 5 include additional logic blocks that disrupt the regular columnar structure making up a large part of the IC. The additional logic blocks can be programmable blocks and/or dedicated circuitry. For example, a processor block depicted as PROC 910 spans several columns of CLBs and BRAMs.

In one aspect, PROC 910 is implemented as a dedicated circuitry, e.g., as a hard-wired processor, that is fabricated as part of the die that implements the programmable circuitry of the IC. PROC 910 can represent any of a variety of different processor types and/or systems ranging in complexity from an individual processor, e.g., a single core capable of executing program code, to an entire processor system having one or more cores, modules, co-processors, interfaces, or the like.

In another aspect, PROC 910 is omitted from architecture 900 and replaced with one or more of the other varieties of the programmable blocks described. Further, such blocks can be utilized to form a "soft processor" in that the various blocks of programmable circuitry can be used to form a processor that can execute program code as is the case with PROC 910.

The phrase "programmable circuitry" can refer to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, portions shown in FIG. 5 that are external to PROC 910 such as CLBs 903 and BRAMs 903 can be considered programmable circuitry of the IC.

In general, the functionality and connectivity of programmable circuitry are not established until configuration data is loaded into the IC. A set of configuration bits can be used to program programmable circuitry of an IC such as an FPGA. The configuration bit(s) typically is referred to as a "configuration bitstream." In general, programmable circuitry is not operational or functional without first loading a configuration bitstream into the IC. The configuration bitstream effectively implements or instantiates a particular circuit design within the programmable circuitry. The circuit design specifies, for example, functional aspects of the programmable circuit blocks and physical connectivity among the various programmable circuit blocks.

Circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC, e.g., PROC 910.

In some instances, hardwired circuitry can have one or more operational modes that can be set or selected according to register settings or values stored in one or more memory elements within the IC. The operational modes can be set, for example, through the loading of a configuration bitstream into the IC. Despite this ability, hardwired circuitry is not considered programmable circuitry as the hardwired circuitry is operable and has a particular function when manufactured as part of the IC.

FIG. 5 is intended to illustrate an exemplary architecture that can be used to implement an IC that includes programmable circuitry, e.g., a programmable fabric. For example, the number of logic blocks in a column, the relative width of the columns, the number and order of columns, the types of logic blocks included in the columns, the relative sizes of the logic blocks, and the interconnect/logic implementations included at the top of FIG. 5 are purely exemplary. In an actual IC, for example, more than one adjacent column of CLBs is typically included wherever the CLBs appear, to facilitate the efficient implementation of a user circuit design. The number of adjacent CLB columns, however, can vary with the overall size of the IC. Further, the size and/or positioning of blocks such as PROC 910 within the IC are for purposes of illustration only and are not intended as a limitation.

In the above embodiments, the various features have been described with reference to the FPGA portion 100. However, in other embodiments, the various features described herein may be provided for any integrated circuit, which may or may not be a FPGA. For example, in other embodiments, the various features (such as the voltage control circuitry, the different modes of operations, etc.) described herein may be provided for other types of processors.

Although particular embodiments have been shown and described, it will be understood that it is not intended to limit the claimed inventions to the preferred embodiments, and it will be obvious to those skilled in the art that various changes and modifications may be made without department from the spirit and scope of the claimed inventions. The specification and drawings are, accordingly, to be regarded in an illustrative rather than restrictive sense. The claimed inventions are intended to cover alternatives, modifications, and equivalents.

What is claimed is:

1. An integrated circuit, comprising:
   a voltage rail;
   voltage control circuitry coupled to the voltage rail; and
   a circuit block coupled to the voltage control circuitry;
   wherein the voltage control circuitry is selectively configurable to operate the circuit block in at least a first mode of operation or a second mode of operation;
   wherein in the first mode of operation, the circuit block receives a voltage that is substantially the same as a voltage of the voltage rail, and operates at a first speed;
   wherein in the second mode of operation, the circuit block receives a voltage that is less than the voltage of the voltage rail by a threshold voltage, and operates at a second speed that is slower than the first speed; and
   wherein the circuit block is configured to operate in the first mode of operation or the second mode of operation based at least in part on whether the circuit block is on a path having a slack that is less than a predetermined threshold, the slack being a measure of a margin by which the path meets a timing requirement of the integrated circuit.

2. The integrated circuit of claim 1, wherein the voltage control circuitry comprises an NMOS transistor and a PMOS transistor connected in parallel.

3. The integrated circuit of claim 2, wherein in the first mode of operation, the PMOS transistor is turned on.

4. The integrated circuit of claim 2, wherein in the second mode of operation, the NMOS transistor is turned on and the PMOS transistor is turned off.

5. The integrated circuit of claim 2, wherein the voltage control circuitry is selectively configurable to operate the circuit block in three modes of operation that includes the first mode, the second mode, and a third mode of operation; and
   wherein, in the third mode of operation, both the NMOS transistor and the PMOS transistor are turned off.

6. The integrated circuit of claim 2, further comprising memory cells, wherein gates of the NMOS transistor and the PMOS transistor are controlled by the memory cells.

7. The integrated circuit of claim 2, wherein the NMOS transistor and the PMOS transistor have respective sizes that are based upon an expected current draw of the circuit block.

8. The integrated circuit of claim 1, wherein the voltage control circuitry comprises a PMOS transistor and a multiplexor, and wherein an output of the multiplexor is connected to a gate of the PMOS transistor.

9. The integrated circuit of claim 8, wherein the multiplexor is selectively configurable to receive input from the voltage rail, to receive input from a virtual voltage rail, or to connect to ground.

10. The integrated circuit of claim 8, wherein the multiplexor is selectively configurable to connect the circuit block to ground.

11. The integrated circuit of claim 8, wherein the multiplexor is selectively configurable to connect the circuit block to the voltage rail.

12. The integrated circuit of claim 8, wherein the multiplexor is selectively configurable to connect the circuit block to a virtual voltage rail.

13. The integrated circuit of claim 8, further comprising one or more memory cells for selecting an input of the multiplexor.

14. The integrated circuit of claim 1, wherein the voltage control circuitry is selectively configurable to operate the circuit block in at least the first mode of operation or the second mode of operation based at least in part on whether a slack associated with the circuit block exceeds a timing requirement.

15. A method of configuring one or more circuit block(s) in an integrated circuit, comprising:
   identifying a circuit block in the integrated circuit, the integrated circuit having a voltage rail and a voltage control circuitry;
   determining whether a criteria is satisfied; and
   selectively configuring the voltage control circuitry to operate the circuit block in a first mode of operation or a second mode of operation based at least in part on a result from the act of determining;
   wherein in the first mode of operation, the circuit block receives a voltage that is substantially the same as a voltage of the voltage rail, and operates at a first speed;
   wherein in the second mode of operation, the circuit block receives a voltage that is less than the voltage of the voltage rail by a threshold voltage, and operates at a second speed slower than the first speed; and
   wherein act of determining whether the criteria is satisfied comprises determining whether the circuit block is on a path having a slack that is less than a predetermined threshold, the slack being a measure of a margin by which the path meets a timing requirement of the integrated circuit.

16. The method of claim 15, wherein the act of determining whether the circuit block is on the critical path comprises determining whether a slack exceeds a predetermined threshold.

17. The method of claim 15, wherein the act of selectively configuring the voltage control circuitry comprises turning a NMOS transistor in the voltage control circuitry on or off, and/or turning a PMOS transistor in the voltage control circuitry on or off.

18. The method of claim 15, wherein the voltage control circuitry comprises a PMOS transistor and a MUX coupled to a gate of the PMOS transistor, and wherein the act of selectively configuring the voltage control circuitry comprises selectively operating the MUX in the voltage control circuitry.

19. The method of claim 15, further comprising:
   determining whether an additional circuit block is an active circuit block, the additional circuit block having its corresponding voltage control circuitry; and
   selectively configuring the voltage control circuitry of the additional circuit block so that the additional circuit block is in a "power gated mode".

* * * * *